United States Patent
Karilainen

(10) Patent No.: US 10,075,570 B2
(45) Date of Patent: Sep. 11, 2018

(54) PROVIDING SENSING ABILITY WITH A WIRELESS COMMUNICATION APPARATUS

(71) Applicant: Microsoft Technology Licensing, LLC, Redmond, WA (US)

(72) Inventor: Antti Karilainen, Helsinki (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/232,679

(22) Filed: Aug. 9, 2016

(65) Prior Publication Data
US 2018/0048745 A1    Feb. 15, 2018

(51) Int. Cl.
*H04M 1/00* (2006.01)
*H04M 1/02* (2006.01)
*H04B 1/3827* (2015.01)

(52) U.S. Cl.
CPC ........ *H04M 1/0245* (2013.01); *H04B 1/3838* (2013.01); *H04M 2250/12* (2013.01)

(58) Field of Classification Search
CPC ........................... H04M 1/0245; H04B 1/3838
USPC ................ 455/41.1, 41.2, 41.3, 575.3, 575.1
See application file for complete search history.

(56) References Cited

U.S. PATENT DOCUMENTS

| | | | |
|---|---|---|---|
| 6,862,432 B1 | 3/2005 | Kim | |
| 7,079,877 B2 | 7/2006 | Shoji et al. | |
| 7,453,405 B2 | 11/2008 | Nishikido et al. | |
| 7,659,855 B2 | 2/2010 | Mashima et al. | |
| 8,160,659 B2 | 4/2012 | Okumura et al. | |
| 9,083,074 B2 | 7/2015 | Ayatollahi et al. | |
| 9,214,717 B2 | 12/2015 | Tudosoiu | |
| 2008/0143609 A1* | 6/2008 | Mashima | H01Q 1/243 343/702 |
| 2009/0305641 A1* | 12/2009 | Kubono | H04B 13/005 455/67.11 |
| 2010/0062709 A1* | 3/2010 | Kato | G01R 29/0878 455/41.1 |
| 2010/0279630 A1* | 11/2010 | Brady | H04B 1/48 455/83 |
| 2011/0076966 A1 | 3/2011 | Ishimiya | |
| 2011/0156970 A1 | 6/2011 | Wong et al. | |
| 2011/0157057 A1* | 6/2011 | Hata | G06F 1/1681 345/173 |

(Continued)

FOREIGN PATENT DOCUMENTS

| | | |
|---|---|---|
| EP | 3016285 A1 | 5/2016 |
| WO | 2005112280 A1 | 11/2005 |
| WO | 2015163880 A1 | 10/2015 |

OTHER PUBLICATIONS

Myllymäki, Sami, "Capacitive Antenna Sensor for User Proximity Recognition", In Publication of University of Oulu, Retrieved on: May 2, 2016, 60 pages.

(Continued)

*Primary Examiner* — Md Talukder

(57) ABSTRACT

According to one aspect, there is provided a wireless communication apparatus comprising an antenna configured to operate as an antenna and as an electrode, a reference part configured to provide a reference potential, and a sensor module connected to the electrode and to the reference potential, the sensor module being configured to measure a change in the potential between the electrode and the reference potential.

20 Claims, 4 Drawing Sheets

(56) References Cited

U.S. PATENT DOCUMENTS

| | | | |
|---|---|---|---|
| 2011/0183601 A1* | 7/2011 | Hannon | B60K 35/00 455/1 |
| 2011/0230146 A1* | 9/2011 | Morishita | H01Q 1/243 455/77 |
| 2011/0237293 A1* | 9/2011 | Komine | H04M 1/72583 455/550.1 |
| 2011/0294433 A1* | 12/2011 | Matsubara | H04M 1/7253 455/41.3 |
| 2011/0316804 A1* | 12/2011 | Tanaka | G06F 3/047 345/173 |
| 2012/0196651 A1* | 8/2012 | Nakamura | H01Q 1/243 455/556.1 |
| 2012/0214412 A1 | 8/2012 | Schlub et al. | |
| 2012/0329524 A1* | 12/2012 | Kent | G06F 3/044 455/566 |
| 2013/0109438 A1* | 5/2013 | Kwack | H04M 1/0214 455/566 |
| 2013/0217342 A1 | 8/2013 | Abdul-Gaffoor et al. | |
| 2014/0329543 A1* | 11/2014 | Hayashi | H04M 1/7253 455/456.1 |
| 2014/0378182 A1* | 12/2014 | Hara | H05K 1/0216 455/553.1 |
| 2015/0038075 A1* | 2/2015 | Kataoka | H04B 13/005 455/41.1 |
| 2015/0038864 A1* | 2/2015 | Kataoka | A61B 5/0402 600/509 |
| 2015/0116153 A1 | 4/2015 | Chen et al. | |
| 2015/0288400 A1* | 10/2015 | Nguyen | H04B 1/126 455/136 |
| 2015/0303568 A1 | 10/2015 | Yarga et al. | |
| 2015/0372371 A1 | 12/2015 | Lagnado et al. | |
| 2016/0224171 A1* | 8/2016 | Kim | G06F 3/0488 |

OTHER PUBLICATIONS

"International Search Report and Written Opinion Issued in PCT Application No. PCT/US2017/045003", dated Nov. 14, 2017, 12 Pages.

* cited by examiner

PROVIDING SENSING ABILITY WITH A WIRELESS COMMUNICATION APPARATUS

BACKGROUND

Wireless communication apparatuses, for example, tablet computers and smart phones comprise a variety of sensors for implementing specific sensing functionalities. For example, an ambient light sensor can be used for automatically adjusting screen brightness and a proximity sensor can be used to determine whether a user is close to his device or not. When separate sensors are used for specific sensing functionalities, this also requires space for the sensor components in a wireless communication apparatus.

SUMMARY

This Summary is provided to introduce a selection of concepts in a simplified form that are further described below in the Detailed Description. This summary is not intended to identify key features or essential features of the claimed subject matter, nor is it intended to be used to limit the scope of the claimed subject matter.

In one embodiment, a wireless communication apparatus is provided. The wireless communication apparatus comprises an antenna configured to operate as an antenna and as an electrode, a reference part configured to provide a reference potential and a sensor module connected to the electrode and to the reference potential. The sensor module is configured to measure a change in the potential between the electrode and the reference potential.

In another embodiment, a foldable wireless communication apparatus is provided. The foldable wireless communication apparatus comprises a first apparatus part and a second apparatus part, wherein the first apparatus part and the second apparatus part are foldably connected to each other. The at least one antenna is configured to operate as an antenna and as an electrode, the at least antenna being located in at least one of the first apparatus part and the second apparatus part. The foldable wireless communication apparatus further comprises a reference part configured to provide a reference potential and a sensor module connected to the electrode and to the reference potential, the sensor module being configured to measure a change in the potential between the electrode and the reference potential.

In another embodiment, a method is provided. The method comprises storing, by at least one processor, a plurality of potential ranges and corresponding states relating to a wireless communication apparatus relating to the ranges, causing, by the at least one processor, measurement of a change in the potential between an antenna acting both as an antenna and an electrode and a reference part configured to provide a reference potential, and determining, by the at least one processor, a state relating to the wireless communication apparatus based on the measured change in potential between the electrode and the reference potential and the information stored in the memory.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. However, the same or equivalent functions and sequences may be accomplished by different examples. Furthermore, as used in this application and in the claims, the singular forms "a," "an," and "the" include the plural forms unless the context clearly dictates otherwise. Additionally, the term "includes" means "comprises." Further, the term "coupled" encompasses mechanical, electrical, magnetic, optical, as well as other practical ways of coupling or linking items together, and does not exclude the presence of intermediate elements between the coupled items.

In wireless communication apparatuses, for example, in tablet computers and smart phones, separate sensors or other apparatus components are used to enable a specific functionality relating to the apparatus. When new sensors or other apparatus components are used for specific sensing functionalities, this also requires space for the new sensors or components in a wireless communication apparatus.

In at least some embodiments a solution is provided where existing apparatus components are used to achieve sensing the same or similar functionality that would normally require use of apparatus components required specifically for this purpose.

In at least some embodiments a solution is provided where an antenna is configured to operate both as an antenna and as an electrode. The use of the antenna as the electrode enables to determine a change in the potential between the electrode and a reference potential. This enables, for example, proximity sensing functionality since a user's proximity is sensed as a change in the potential.

Figure 1:
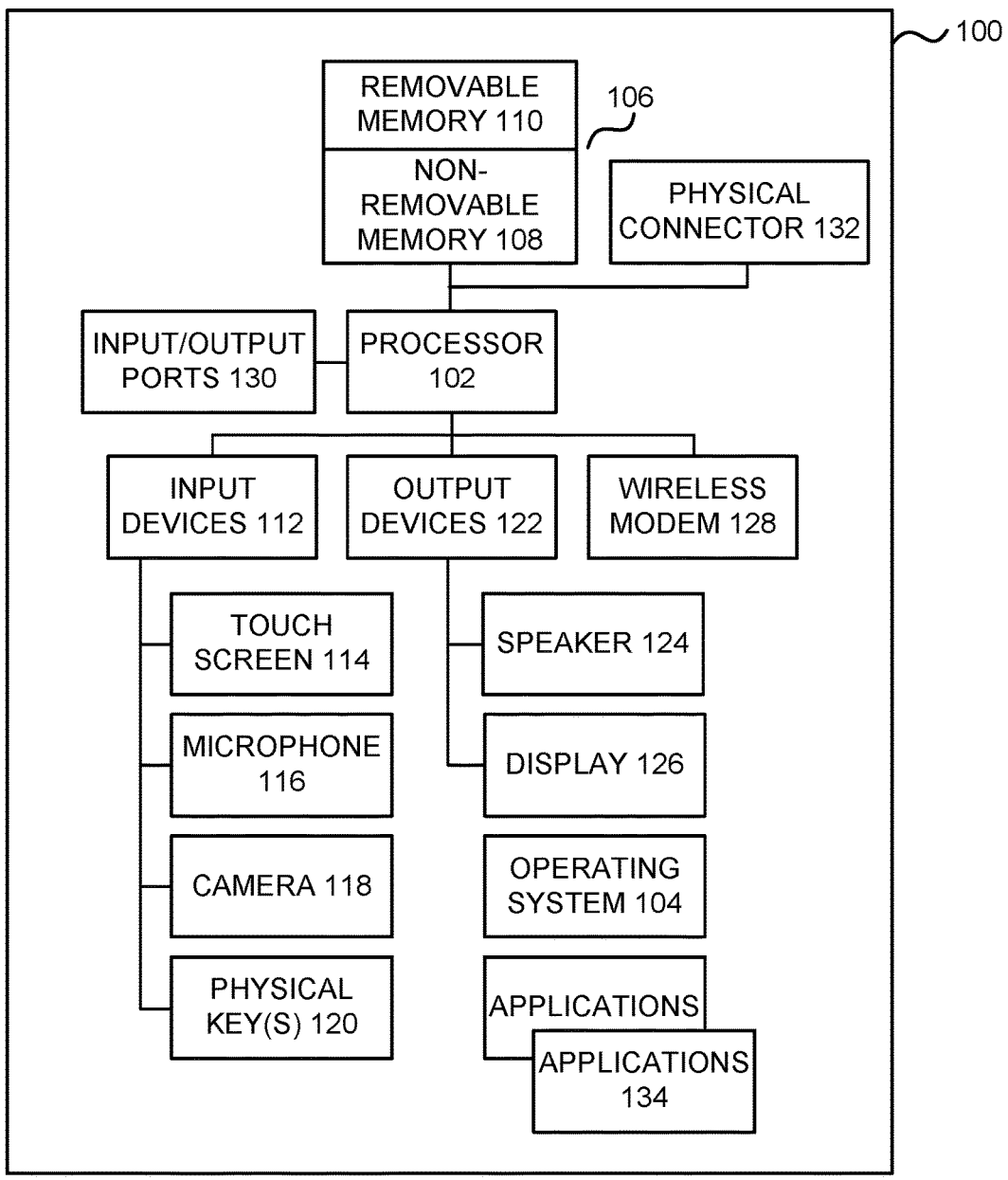
FIG. 1 is a system diagram depicting an apparatus including a variety of optional hardware and software components.

FIG. 1 is a system diagram depicting an apparatus 100 including a variety of optional hardware and software components. Any components in the apparatus 100 can communicate with any other component, although not all connections are shown, for ease of illustration. The apparatus 100 can be any of a variety of computing devices (for example, a cell phone, a smartphone, a handheld computer, a tablet computer, a Personal Digital Assistant (PDA), a network server etc.).

The illustrated apparatus 100 can include a controller or processor 102 (e.g., signal processor, microprocessor, ASIC, or other control and processing logic circuitry) for performing such tasks as signal coding, data processing, input/output processing, power control, and/or other functions. An operating system 104 can control the allocation and usage of the components and support for one or more application programs 134. The application programs can include common mobile computing applications (e.g., email applications, calendars, contact managers, web browsers, messaging applications), or any other computing application.

The illustrated apparatus 100 can include a memory 106. The memory 106 can include non-removable memory 108 and/or removable memory 110. The non-removable memory 108 can include RAM, ROM, flash memory, a hard disk, or other well-known memory storage technologies. The removable memory 110 can include flash memory or a Subscriber Identity Module (SIM) card, which is well known in mobile communication systems, or other well-known memory storage technologies, such as "smart cards". The memory 106 can be used for storing data and/or code for running the operating system 104 and the applications 134. If the apparatus 100 is a mobile phone or smart phone, the memory 106 can be used to store a subscriber identifier, such as an International Mobile Subscriber Identity (IMSI), and an equipment identifier, such as an International Mobile Equipment Identifier (IMEI). Such identifiers can be transmitted to a network server to identify users and equipment.

The apparatus 100 can support one or more input devices 112, such as a touchscreen 114, microphone 116, camera 118 and/or physical keys or a keyboard 120 and one or more output devices 122, such as a speaker 124 and a display 126. Some devices can serve more than one input/output function. For example, the touchscreen 114 and the display 126 can be combined in a single input/output device. The input devices 112 can include a Natural User Interface (NUI). An NUI is any interface technology that enables a user to interact with a device in a "natural" manner, free from artificial constraints imposed by input devices such as mice, keyboards, remote controls, and the like. Examples of NUI methods include those relying on speech recognition, touch and stylus recognition, gesture recognition both on screen and adjacent to the screen, air gestures, head and eye tracking, voice and speech, vision, touch, gestures, and machine intelligence. Other examples of a NUI include motion gesture detection using accelerometers/gyroscopes, facial recognition, 3D displays, head, eye, and gaze tracking, immersive augmented reality and virtual reality systems, all of which provide a more natural interface, as well as technologies for sensing brain activity using electric field sensing electrodes (EEG and related methods). Thus, in one specific example, the operating system 104 or applications 134 can comprise speech-recognition software as part of a voice user interface that allows a user to operate the apparatus 100 via voice commands. Further, the apparatus 100 can comprise input devices and software that allows for user interaction via a user's spatial gestures, such as detecting and interpreting gestures to provide input to a gaming application.

A wireless modem 128 can be coupled to an antenna (not shown) and can support two-way communications between the processor 102 and external devices, as is well understood in the art. The modem 128 is shown generically and can include a cellular modem for communicating with the mobile communication network and/or other radio-based modems (e.g., Bluetooth or Wi-Fi). The wireless modem 128 is typically configured for communication with one or more cellular networks, such as a GSM network for data and voice communications within a single cellular network, a WCDMA (Wideband Code Division Multiple Access) network, an LTE (Long Term Evolution) network, a 4G LTE network, between cellular networks, or between the mobile apparatus and a public switched telephone network (PSTN) etc.

The apparatus 100 can further include at least one input/output port 130 and/or a physical connector 132, which can be a USB port, a USB-C port, IEEE 1394 (FireWire) port, and/or RS-232 port. The illustrated components are not required or all-inclusive, as any components can deleted and other components can be added.

Any combination of the illustrated components disclosed in FIG. 1, for example, at least one of the processor 102 and the memory 106 may constitute means for storing at least one or a plurality of potential ranges and corresponding states relating to the apparatus relating to the ranges in a memory, means for measuring a change in the potential between an antenna acting both as an antenna and an electrode and a reference part configured to provide a reference potential, and means for determining a state relating to the apparatus based on the measured change in potential between the electrode and the reference potential and the information stored in the memory.

Figure 2A:
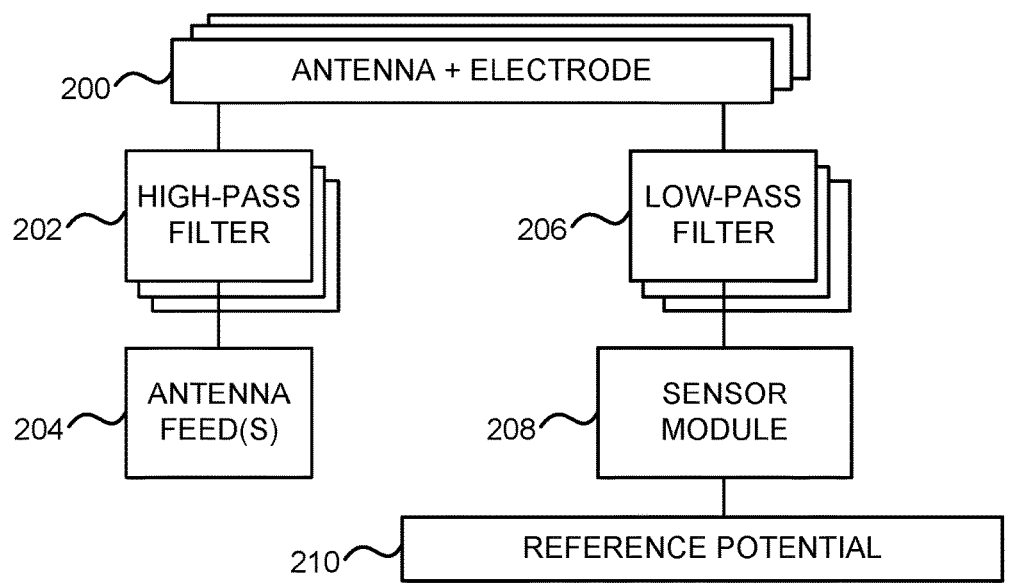
FIG. 2A is a block diagram illustrating a wireless communication apparatus for enabling sensing functionality according to one embodiment.

FIG. 2A is a block diagram illustrating a wireless communication apparatus for enabling sensing functionality according to one embodiment.

The wireless communication apparatus comprises at least one antenna 200. The antenna or antennas enable wireless communication capabilities for the wireless communication apparatus via a cellular network, for example, a WCDMA (Wideband Code Division Multiple Access) network, an LTE (Long Term Evolution) network, a 4G LTE network etc. In this embodiment, the antenna 200 is connected to an antenna feed(s) 204 and to possible tune component(s) via a high-pass filter 202. In some other embodiments, the high-pass filter 202 may be integrated with the tuning components(s) or to the structure of the antenna 200 itself.

The antenna 200 acts also as an electrode and is connected via a low-pass filter 206 to a sensor module 208. The sensor module 208 is further connected to a reference part configured to provide a reference potential 210 within the wireless communication apparatus. The reference potential 210 refers, for example, to which the potential where all device components/electronics are connected. In some other embodiments, the low-pass filter 206 may be integrated into the sensor module 208.

The sensor module 208 comprises all the necessary electronics needed to measure the electric field or potential between the electrode and the reference potential 210. The sensor module 208 may also comprise a processor and a memory for storing at least one or a plurality of potential ranges and corresponding states relating to the wireless communication apparatus relating to the ranges. The term "state" may refer, for example, to a folding state or configuration of the wireless communication apparatus, to a situation where an external protecting cover is or is not applied on a display of the wireless communication apparatus, to a situation for determining whether a user is touching or gripping the wireless communication apparatus, or to a situation for detecting on object or user close to the wireless communication apparatus. The term "state" may also refer to or indicate a certain gripping state when a user is holding the wireless communication apparatus in his/her hand. For example, how the user holds the apparatus in his/her hand and what parts of the apparatus are touched.

The processor may be configured to execute an application program stored in the memory to store a plurality of potential ranges and corresponding states relating to the wireless communication apparatus of a wireless communication apparatus relating to the ranges in the memory, cause measurement of a change in the potential between an antenna acting both as an antenna and an electrode and a reference potential, and determine a state relating to the wireless communication apparatus based on the measured change in potential between the electrode and the reference potential and the information stored in the memory. In another embodiment, the processor and the memory are arranged to locate outside the sensor module 208.

For example, when a user places his hand in the vicinity of an antenna that acts also as an electrode, this changes capacitance sensed by the sensor module 308 if the sensor module 308 is a capacitive sensor module. The change in the capacitance in turn then causes a change in the voltage between the electrode and the reference potential 210.

Figure 2B:
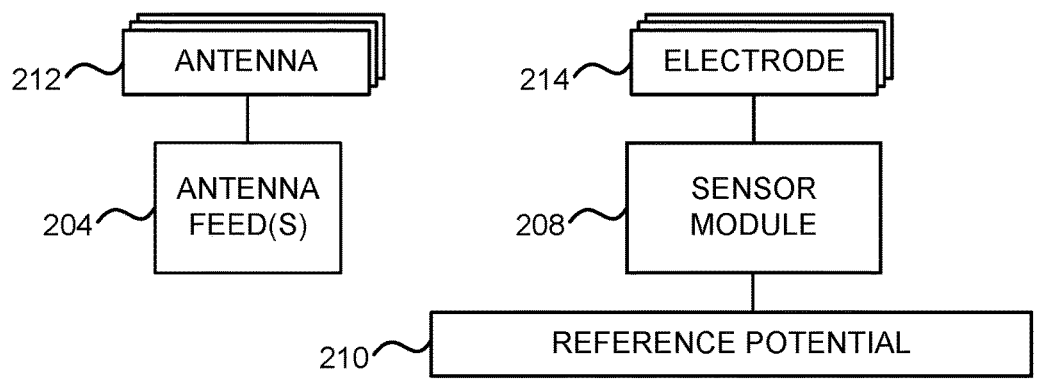
FIG. 2B is a block diagram illustrating another wireless communication apparatus for enabling sensing functionality according to one embodiment.

FIG. 2B is a block diagram illustrating another wireless communication apparatus for enabling sensing functionality according to one embodiment. The wireless communication apparatus illustrated in FIG. 2B differs from the wireless communication apparatus illustrated in FIG. 2A in that an antenna acting as an electrode 214 is a separate element from other antenna(s) 212 and high-pass or low-pass filtering may or may not be used.

Figure 3A:
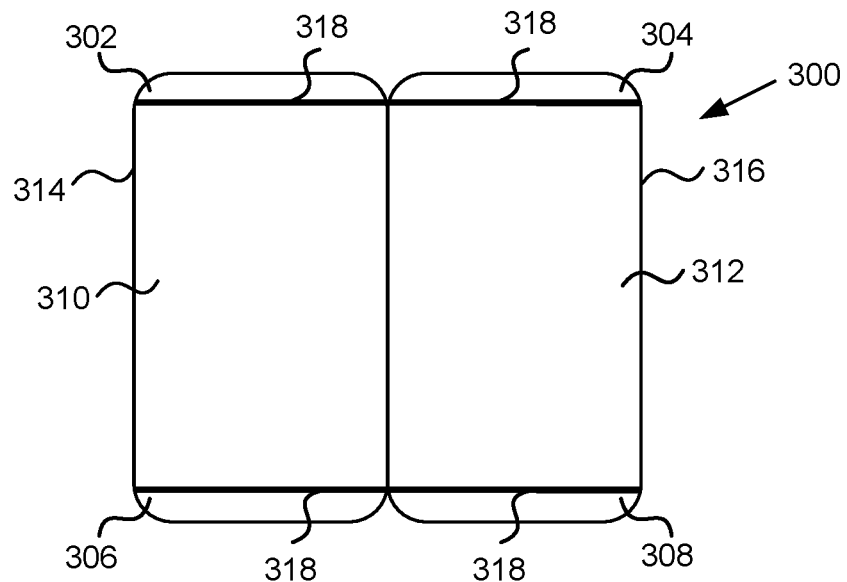
FIG. 3A illustrates a foldable wireless communication apparatus 300 in an unfolded state according to one embodiment.

FIG. 3A illustrates a foldable wireless communication apparatus 300 in an unfolded state according to one embodiment. The wireless communication apparatus 300 may comprise apparatus elements illustrated already in FIG. 2A or FIG. 2B and also other apparatus elements illustrated, for example, in FIG. 1.

FIG. 3A illustrates that the wireless communication apparatus 300 comprises a first apparatus part 314 and a second apparatus part 316. The first apparatus part 314 and the second apparatus part 316 are foldably connected to each other. FIG. 3A illustrates a situation where the first apparatus part 314 and the second apparatus part 316 reside in a same plane and thus the wireless communication apparatus 300 is in an opened state. The first apparatus part 314 comprises two antennas or antenna parts 302, 306. Similarly, the second apparatus part 316 comprises two antenna antennas or antenna parts 304, 308. Whereas the antenna parts 302, 306 act only as antennas, the antenna parts 304, 308 act both as antennas and electrodes providing sensing functionality. The first apparatus part 314 also comprises a first reference part 310. Similarly, the second apparatus part 316 comprises a second reference part 312.

Antenna stripes 318 of the antenna parts 302, 306 separate the antenna parts 302, 306 from the first reference part 310. Similarly, antenna stripes 318 of the antenna parts 304, 308 separate the antenna parts 304, 308 from the second reference part 312.

The wireless communication apparatus 300 may also comprise a memory configured to store a plurality of potential ranges and corresponding states relating to the ranges and a processor configured to determine a state relating to the wireless communication apparatus 300 based on the measured change in potential between the electrode and the reference potential and the information stored in the memory. For example, the memory may store a predetermined potential range that relates to an unfolded state of the wireless communication apparatus 300. Thus, when the change in the potential between the electrode 304, 308 and the reference part 312 is within the predetermined potential range, the wireless communication apparatus 300 is interpreted to be in the unfolded state.

In another embodiment, a user may touch the wireless communication apparatus 300 or place his finger in the vicinity of the second apparatus part 316. The vicinity of the finger may be identified due to a change in the potential between the electrode 304, 308 and the reference potential 312.

Figure 3B:
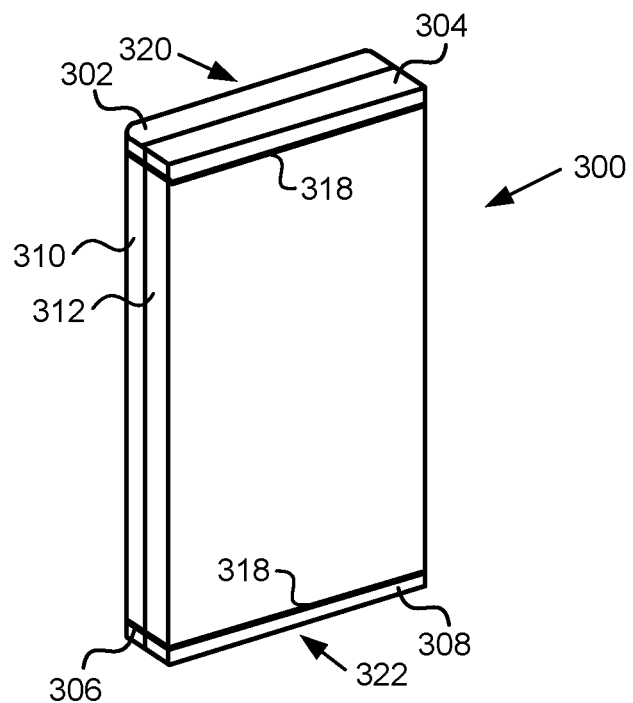
FIG. 3B illustrates the wireless communication apparatus 300 in a closed state according to one embodiment.

FIG. 3B illustrates the wireless communication apparatus 300 in a closed state according to one embodiment.

In FIGS. 3A and 3B, if a top part 320 and/or a bottom part 322 of the wireless communication apparatus 300 comprises an antenna acting both as an antenna and an electrode, the antenna can be used to detect finger or hand.

Figure 4:
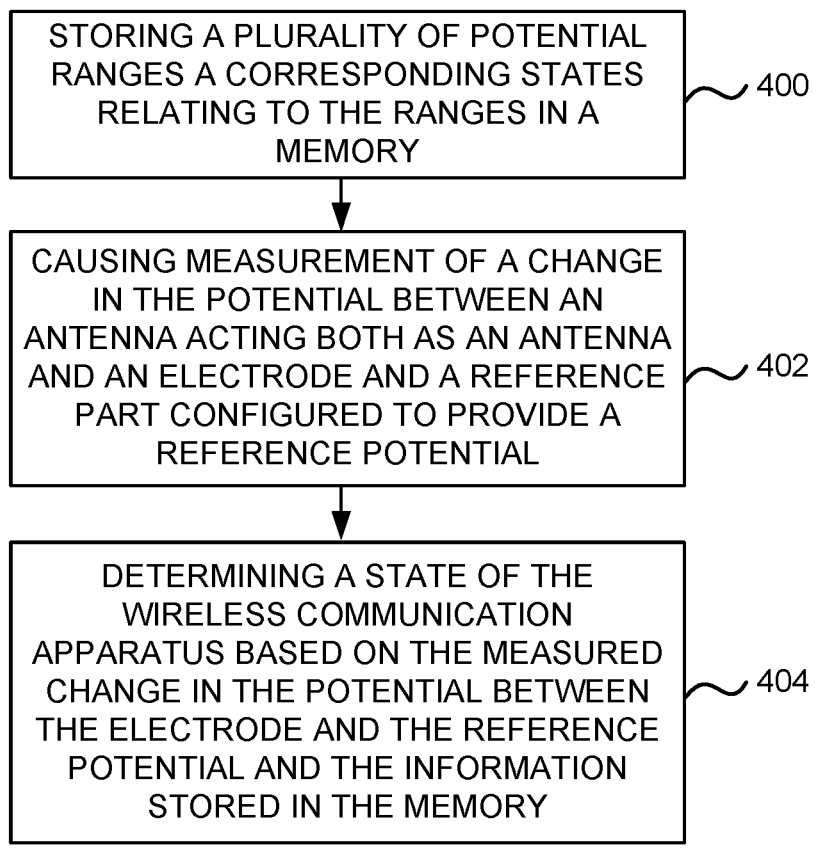
FIG. 4 is a flow diagram illustrating a method for determining a state of a wireless communication apparatus according to one embodiment.

FIG. 4 is a flow diagram illustrating a method for determining a state of a wireless communication apparatus according to one embodiment. In one embodiment, the wireless communication apparatus comprises at least one processor and at least one memory, and the at least one memory stores program instructions that, when executed by the at least one processor, cause the wireless communication apparatus to perform the method.

At 400 at least one or a plurality of potential ranges and corresponding states relating to the ranges is stored in a memory of a wireless communication apparatus. At 402 a change in the potential between an antenna acting both as an antenna and an electrode and a reference potential of a wireless communication apparatus is caused to be measured by at least one processor of the wireless communication apparatus. At 404 a state relating to the wireless communication apparatus is determined by the at least one processor based on the measured change in potential between the electrode and the reference potential and the information stored in the memory.

At least some of the embodiments illustrated above enable using existing apparatus components in achieving sensing functionality for which normally separate sensors are needed. For example, normally a proximity sensor is used to detect user proximity. At least some of the embodiments illustrated above enable detecting user proximity using an antenna or a folding state of a foldable wireless communication apparatus.

Further, at least some of the embodiments illustrated above enable sensing capability in all sensing directions, for example, when the antenna acting as an electrode is used for providing proximity sensing.

Further, at least some of the embodiments illustrated above enable identification of a case or a cover covering a display of the wireless communication apparatus.

Further, at least some of the embodiments illustrated above save space in a wireless communication apparatus since existing apparatus components normally used for other purposes can be used to provide also sensing functionality.

According to an aspect, there is provided a wireless communication apparatus comprising an antenna configured to operate as an antenna and as an electrode, a reference part configured to provide a reference potential and a sensor module connected to the electrode and to the reference potential, the sensor module being configured to measure a change in the potential between the electrode and the reference potential.

In one embodiment, the wireless communication apparatus comprises a plurality of antennas, wherein at least two antennas are configured to operate as an antenna and as an electrode.

In one embodiment, the wireless communication apparatus comprises an antenna configured to operate as an antenna and as an electrode at both ends of the wireless communication apparatus in the longitudinal direction.

In one embodiment, alternatively or in addition to any of the preceding embodiments, the wireless communication apparatus further comprises an antenna feed and a high-pass filter between the antenna and the antenna feed.

In one embodiment, alternatively or in addition, the wireless communication apparatus further comprises a low-pass filter between the electrode and the sensor module.

In one embodiment, alternatively or in addition to any of the preceding embodiments, the wireless communication apparatus further comprises a memory configured to store at least one or a plurality of potential ranges and corresponding states relating to the wireless communication apparatus relating to the ranges, and a processor configured to determine a state relating to the wireless communication apparatus based on the measured the change in the potential between the electrode and the reference potential and the information stored in the memory.

In one embodiment, alternatively or in addition to any of the preceding embodiments, the processor is configured to identify a cover of the wireless communication apparatus based on the measured change in potential between the electrode and the reference potential and the information stored in the memory.

In one embodiment, alternatively or in addition to any of the preceding embodiments, the processor is configured to identify proximity of a user of the wireless communication apparatus based on the measured change in potential between the electrode and the reference potential and the information stored in the memory.

According to another embodiment, there is provided a foldable wireless communication apparatus comprising a first apparatus part, a second apparatus part, wherein the first apparatus part and the second apparatus part are foldably connected to each other, at least one antenna configured to operate as an antenna and as an electrode, the at least antenna being located in at least one of the first apparatus part and the second apparatus part, a reference part configured to provide a reference potential, and a sensor module connected to the electrode and to the reference potential, the sensor module being configured to measure a change in the potential between the electrode and the reference potential.

In one embodiment, the foldable wireless communication apparatus comprises a plurality of antennas each of which being configured to operate as an antenna and as an electrode.

In one embodiment, the foldable wireless communication apparatus comprises an antenna configured to operate as an antenna and as an electrode at both ends of the apparatus in the longitudinal direction.

In one embodiment, alternatively or in addition to any of the preceding embodiments, the foldable wireless communication apparatus comprises an antenna feed and a high-pass filter between the antenna and the antenna feed.

In one embodiment, alternatively or in addition to any of the preceding embodiments, the foldable wireless communication apparatus comprises a low-pass filter between the electrode and the sensor module.

In one embodiment, alternatively or in addition to any of the preceding embodiments, the foldable wireless communication apparatus comprises a memory configured to store at least one or a plurality of potential ranges and corresponding states of the foldable wireless communication apparatus relating to the ranges, and a processor configured to determine a state relating to the foldable wireless communication apparatus based on the measured change in potential between the electrode and the reference potential and the information stored in the memory.

In one embodiment, alternatively or in addition to any of the preceding embodiments, the processor is configured to identify a folding state of the foldable wireless communication apparatus based on the measured change in potential between the electrode and the reference potential and the information stored in the memory.

In one embodiment, alternatively or in addition to any of the preceding embodiments, the processor is configured to identify proximity of a user of the foldable wireless communication apparatus based on the measured change in potential between the electrode and the reference potential and the information stored in the memory.

In one embodiment, alternatively or in addition to any of the preceding embodiments, the processor is configured to identify a cover of the foldable wireless communication apparatus based on the measured change in potential between the electrode and the reference potential and the information stored in the memory.

According to another aspect, there is provided a method comprising storing, by at least one processor, at least one or a plurality of potential ranges and corresponding states relating to a wireless communication apparatus relating to the ranges, causing, by the at least one processor, measurement of a change in the potential between an antenna acting both as an antenna and an electrode and a reference part configured to provide a reference potential, and determining, by the at least one processor, a state relating to the wireless communication apparatus based on the measured change in potential between the electrode and the reference potential and the information stored in the memory.

In one embodiment, the method further comprises identifying a folding state of the foldable wireless communication apparatus based on the measured change in potential between the electrode and the reference potential and the information stored in the memory.

In one embodiment, alternatively or in addition to any of the preceding embodiments, the method further comprises identifying proximity of a user of the wireless communication apparatus based on the measured change in potential between the electrode and the reference potential and the information stored in the memory.

In one embodiment, alternatively or in addition to any of the preceding embodiments, the method further comprises identifying a cover of the wireless communication apparatus based on the measured change in potential between the electrode and the reference potential and the information stored in the memory.

According to another aspect, there is provided a computer program comprising program code, which when executed by at least one processor, causes an apparatus to store at least one or a plurality of potential ranges and corresponding states relating to a wireless communication apparatus relating to the ranges, cause measurement of a change in the potential between an antenna acting both as an antenna and an electrode and a reference part configured to provide a reference potential, and determine a state relating to the wireless communication apparatus based on the measured change in potential between the electrode and the reference potential and the information stored in the memory.

In one embodiment, the computer program is embodied on a computer-readable medium.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a- chip systems (SOCs), Complex Programmable Logic Devices (CPLDs), Graphics Processing Units (GPUs).

The functions described herein performed by a controller may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include disks, thumb drives, memory etc. and do not include propagated signals. The software can be suitable for execution on a parallel processor or a serial processor such that the method steps may be carried out in any suitable order, or simultaneously.

Although the subject matter may have been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages.

Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification. In particular, the individual features, elements, or parts described in the context of one example, may be connected in any combination to any other example also.

The invention claimed is:

1. A wireless communication apparatus comprising:
   a first apparatus part comprising at least one antenna configured to operate as an antenna and as an electrode;
   a second apparatus part comprising at least one antenna configured to operate as an antenna and not as an electrode;
   a reference part configured to provide a reference potential;
   a sensor module connected to the electrode and to the reference potential, the sensor module being configured to measure a change in the potential between the electrode and the reference potential;
   a memory configured to store a plurality of mechanical states relating to the wireless communication apparatus as information; and
   a processor configured to determine one of the plurality of mechanical states stored in the memory based on the change in the potential between the electrode and the reference potential measured by the sensor module and the information stored in the memory.

2. A wireless communication apparatus according to claim 1, wherein the wireless communication apparatus comprises a plurality of antennas, wherein at least two antennas are configured to operate as an antenna and as an electrode.

3. A wireless communication apparatus according to claim 2, wherein the wireless communication apparatus comprises an antenna configured to operate as an antenna and as an electrode at both ends of the wireless communication apparatus in the longitudinal direction.

4. A wireless communication apparatus according to claim 1, further comprising an antenna feed and a high-pass filter between the antenna and the antenna feed.

5. A wireless communication apparatus according to claim 1, further comprising a low-pass filter between the electrode and the sensor module.

6. A wireless communication apparatus according to claim 1, wherein the processor is configured to identify a cover of the wireless communication apparatus based on the measured change in potential between the electrode and the reference potential and the information stored in the memory.

7. A wireless communication apparatus according to claim 1, wherein the processor is configured to identify proximity of a user of the wireless communication apparatus based on the measured change in potential between the electrode and the reference potential and the information stored in the memory.

8. A wireless communication apparatus according to claim 1, further comprising the memory configured to store a plurality of potential ranges corresponding to each of the plurality of mechanical states relating to the wireless communication apparatus.

9. A wireless communication apparatus according to claim 1, wherein the plurality of mechanical states comprises one or more of the following:
   a folding state of the wireless communication apparatus;
   presence of an external protective cover;
   touching of the wireless communication apparatus by a user; and
   presence of an object or user close to the wireless communication apparatus.

10. A wireless communication apparatus according to claim 1, wherein at least one of the plurality of mechanical states comprises a gripping state of the wireless communication device.

11. A foldable wireless communication apparatus comprising:
    a first apparatus part;
    a second apparatus part, wherein the first apparatus part and the second apparatus part are foldably connected to each other;
    at least one antenna in the first apparatus part configured to operate as an antenna and as an electrode, and at least one antenna in the second apparatus part configured to operate as an antenna and not as an electrode;
    a reference part configured to provide a reference potential;
    a sensor module connected to the electrode and to the reference potential, the sensor module being configured to measure a change in the potential between the electrode and the reference potential;

a memory configured to store a plurality of mechanical states relating to the foldable wireless communication apparatus as information; and a processor configured to determine one of the plurality of mechanical states stored in the memory based on the change in the potential between the electrode and the reference potential measured by the sensor module and the information stored in the memory.

12. A foldable wireless communication apparatus according to claim 11, wherein the apparatus comprises a plurality of antennas, wherein at least two are configured to operate as an antenna and as an electrode.

13. A foldable wireless communication apparatus according to claim 12, wherein the apparatus comprises an antenna configured to operate as an antenna and as an electrode at both ends of the apparatus in the longitudinal direction.

14. A foldable wireless communication apparatus according to claim 11, wherein the processor is configured to identify a folding state of the foldable wireless communication apparatus based on the measured change in potential between the electrode and the reference potential and the information stored in the memory.

15. A foldable wireless communication apparatus according to claim 11, wherein the processor is configured to identify proximity of a user of the foldable wireless communication apparatus based on the measured change in potential between the electrode and the reference potential and the information stored in the memory.

16. A foldable wireless communication apparatus according to claim 11, wherein the processor is configured to identify a cover of the foldable wireless communication apparatus based on the measured change in potential between the electrode and the reference potential and the information stored in the memory.

17. A foldable wireless communication apparatus according to claim 11, wherein
the plurality of mechanical states comprises one or more of the following:

a folding state of the wireless communication apparatus;
presence of an external protective cover;
touching of the wireless communication apparatus by a user; and
presence of an object or user close to the wireless communication apparatus.

18. A method comprising:
storing by at least one processor, a plurality of potential ranges and corresponding mechanical states relating to a wireless communication apparatus relating to the ranges in a memory;
causing measurement, by the at least one processor, of a change in the potential between an antenna in a first apparatus part and a reference part configured to provide a reference potential, wherein the wireless communication apparatus comprises a plurality of antennas, the antenna in the first apparatus part configured to operate as an antenna and as an electrode, and at least one antenna in a second apparatus part configured to operate as an antenna and not as an electrode; and
determining, by the at least one processor, a mechanical state relating to the wireless communication apparatus based on the measured change in potential between the electrode and the reference potential and the information stored in the memory.

19. A method according to claim 18, further comprising:
identifying a folding state of the foldable wireless communication apparatus based on the measured change in potential between the electrode and the reference potential and the information stored in the memory.

20. A method according to claim 18, further comprising:
identifying proximity of a user of the wireless communication apparatus based on the measured change in potential between the electrode and the reference potential and the information stored in the memory.

* * * * *